United States Patent [19]
Flynn et al.

[11] Patent Number: 5,801,599
[45] Date of Patent: Sep. 1, 1998

[54] RF WAVEGUIDE TO MICROSTRIP BOARD TRANSITION INCLUDING MEANS FOR PREVENTING ELECTROMAGNETIC LEAKAGE INTO THE MICROSTRIP BOARD

[75] Inventors: Stephen John Flynn; Andrew Patrick Baird, both of Ayrshire, Scotland

[73] Assignee: Cambridge Industries Limited, United Kingdom

[21] Appl. No.: 373,299

[22] PCT Filed: Jun. 30, 1993

[86] PCT No.: PCT/GB93/01369

§ 371 Date: Mar. 28, 1995

§ 102(e) Date: Mar. 28, 1995

[87] PCT Pub. No.: WO94/02970

PCT Pub. Date: Feb. 3, 1994

[30] Foreign Application Priority Data

Jul. 23, 1992 [GB] United Kingdom ............... 9215707

[51] Int. Cl.$^6$ ............................................. H01P 5/107
[52] U.S. Cl. ............................................. 333/26; 333/33
[58] Field of Search ............................................. 333/26, 33

[56] References Cited

U.S. PATENT DOCUMENTS

| | | | |
|---|---|---|---|
| 2,877,429 | 3/1959 | Sommers | 333/24 R |
| 3,895,435 | 7/1975 | Turner et al. | 333/33 X |
| 4,080,579 | 3/1978 | Fassett | 333/246 X |
| 4,494,083 | 1/1985 | Josefsson et al. | 333/246 X |
| 4,562,416 | 12/1985 | Sedivic | 333/26 |
| 4,754,239 | 6/1988 | Sedivec | 333/26 |
| 4,846,696 | 7/1989 | Morelli et al. | 333/260 X |
| 5,045,820 | 9/1991 | Leicht et al. | 333/26 |
| 5,057,798 | 10/1991 | Moye et al. | 333/33 |
| 5,258,727 | 11/1993 | DuPuis et al. | 333/26 |
| 5,280,253 | 1/1994 | Deki et al. | 333/26 |

FOREIGN PATENT DOCUMENTS

| | | |
|---|---|---|
| 0069102 | 1/1983 | European Pat. Off. . |
| 318311 | 5/1989 | European Pat. Off. . |
| 56-153802 | 11/1981 | Japan . |
| 59-40702 | 3/1984 | Japan . |
| 59003 | 3/1988 | Japan ............... 333/33 |
| 5259713 | 10/1993 | Japan ............... 333/33 |

*Primary Examiner*—Benny Lee
*Attorney, Agent, or Firm*—Gifford, Krass, Groh, Sprinklee, Patmore, Anderson & Citkowski, P.C.

[57] ABSTRACT

An RF waveguide signal transition apparatus for minimizing leakage at RF frequency is described which consists of providing a plurality of plated through-holes (16) of blind holes in a circuit board (10). The plated holes (16) are disposed on the circumference of a circle around the RF waveguide to microstrip transition of probe (14) and each of the plated holes (16) is connected to a ground plane (24). The size of distribution of the plated holes provides a barrier to signal leakage at RF frequencies in the range 10.95–11.7 GHz and they also provide a transition impedance similar to the 50 ohm characteristic impedance providing satisfactory matching and minimizing leakage into the board. The apparatus can also be used to minimise leakage from microstrip to microstrip transitions passing through the circuit board.

4 Claims, 2 Drawing Sheets

RF WAVEGUIDE TO MICROSTRIP BOARD TRANSITION INCLUDING MEANS FOR PREVENTING ELECTROMAGNETIC LEAKAGE INTO THE MICROSTRIP BOARD

FIELD OF THE INVENTION

The present invention relates to a waveguide to microstrip transition where a waveguide probe is passed from the waveguide through a circuit board before connecting to the microstrip line. The invention also relates to a microstrip to microstrip transition where a signal carried on the microstrip requires to pass through a multilayer circuit board. The invention is particularly related to transitions for use with radio frequency signals.

DESCRIPTION OF THE RELEVANT PRIOR ART

In a double-sided or multilayer circuit board which is connected to a waveguide, one way in which signals may be taken from the waveguide to the board requires a probe to pass through the waveguide wall and the board so that when the probe protrudes into the waveguide it will pick up signals propagating in the waveguide. In order for such an arrangement to work properly it is necessary to connect the probe to a microstrip conductor. This is typically done by drilling a hole in the circuit board prior to etching the board then fitting a probe in the drilled hole. This arrangement would provide a low loss transition as long as there is no or little loss of signal into the board's materials, such as polytetrafluoroethylene (PTFE) and (FR4), and the probe passing through the board's materials does not present too great a mismatch. However, signal loss into the board's materials is generally significant thereby. resulting in over 1 dB. of loss. This is unacceptable for a low-noise receiver. It is believed that the ground planes on each side of the FR4 act as a parallel plate waveguide into which signals can couple resulting in extra losses and also changing the impedance of the transition causing a mismatch to the microstrip line. Any mismatch will also result in loss of signal.

An object of the present invention is to provide an improved transition which obviates or mitigates at least one of the aforementioned disadvantages.

SUMMARY OF THE INVENTION

In its broadest aspect this is achieved by providing a plurality of plated holes in a circuit board and disposing these plated holes around the RF waveguide or microstrip to microstrip transition and connecting these plated holes to ground. This results in a transition with a substantially improved performance which has much less loss than the prior art arrangement.

In a preferred arrangement all the holes, including the hole receiving the probe are plated through-holes for reasons of simplicity and cost. In an alternative arrangement blind holes can be used The plurality of holes can be provided in a multilayer board or in a double-sided board.

Conveniently, four of these plated through-holes are disposed around the waveguide or microstrip to microstrip probe and are ideally placed on the circumference of a circle centered on the probe. The holes are in close proximity to the feedthrough.

According to one aspect of the present invention there is provided an RF waveguide to circuit transition wherein a waveguide probe passes through a circuit board and is connected to a signal conductor on the circuit board, the circuit board having a ground plane, a plurality of plated holes disposed in proximity to and spaced around the waveguide probe such that the transition impedance is as close as possible to the characteristic impedance of the microstrip line, the plated holes being coupled to the ground plane to minimize leakage of signals carried by the probe into the board. Preferably, the holes are plated throughholes. Alternatively, the holes are plated blind holes. Preferably also the probe hole is plated.

Preferably also, four plated holes are disposed around the periphery of the waveguide probe. Conveniently the plated holes being placed on the circumference of a circle centred on the probe. Alternatively, three, five or any suitable number of holes may be used to achieve satisfactory performance.

It has been found that four such plated through-holes provide satisfactory results, but the spacing of the holes is important in relation to the feed-through, holes requiring to be close in proximity to the feed-through. The required proximity and spacing of the holes is frequency dependent. It is has been found that if the holes are too close, then a transition impedance may be low with respect of the commonly-used characteristic impedance of 50 ohms and if too far away would allow unacceptable leakage into the board. In addition, the spacing of holes in relation to each other is also important as the size of the gap between the plated holes and the frequency of the RF signal dictates how much RF signal can pass between the holes. It will be understood that hole size, hole diameter and spacing are parameters which may be obtained in particular cases by routine experimentation.

According to another aspect of the present invention there is provided a method of minimising leakage of RF signals from a waveguide to conductor transition passing through a circuit board adjacent the waveguide and in which a probe extends through the circuit board and waveguide wall into the waveguide, such method comprising the steps of, disposing a plurality of holes in the circuit board around the periphery of the probe, plating or otherwise covering the side of each hole with a conductive material, and connecting the plated holes to a ground plane.

Preferably, the method involves providing through-holes in the circuit board. Alternatively, the method involves providing blind holes in the circuit board.

Conveniently, the circuit board is a multilayer board.

According to another aspect of the invention there is provided a circuit board for receiving a probe for insertion into a waveguide to receive signals therefrom and transfer these signals to the circuit board, the circuit board comprising, at least one conductor for connection to the probe, a ground plane, a through-hole for receiving the probe, a plurality of plated holes disposed in the circuit board around the periphery of the plated through hole, the plated holes being connected to the ground, the holes being proportioned and dimensioned so that leakage of signals into the circuit board from the probe is minimized.

Preferably, the through-hole for receiving the probe is plated.

According to another aspect of the present invention there is provided a circuit board transition for minimizing-leakage of signals carried on microstrip conductors, which signals pass through the circuit boards, the circuit board transition comprising a first microstrip location on one side of the circuit board for carrying a signal, a second microstrip location on the other side of the board for receiving the signal, signal conducting means passing through the board and connected to the first and the second microstrip conductors, a ground plane disposed in the circuit board, a plurality of plated through holes or blind holes disposed in the circuit board about the periphery of the signal conducting means, the plated through holes or blind holes being coupled to the ground plane to minimize leakage of the signal passing through the board between the first and second microstrip.

BRIEF DESCRIPTION OF THE DRAWINGS

These and other aspects of the invention will become apparent from the following description when taken in combination with the accompanying drawings in which.

DESCRIPTION OF THE PREFERRED EMBODIMENTS

Figure 1:
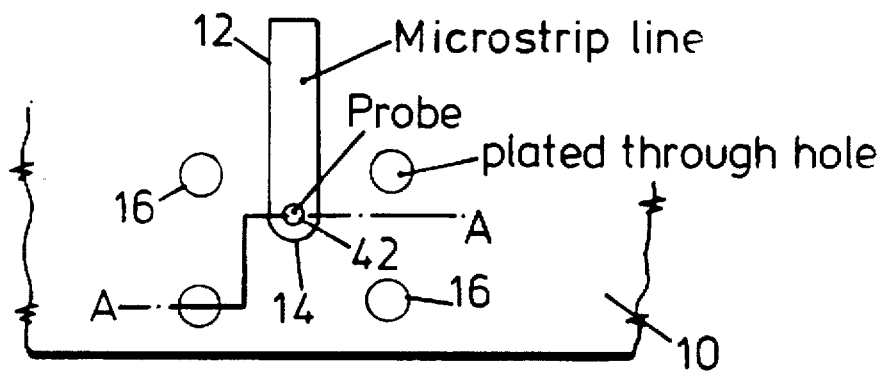
FIG. 1 is a plan view of a waveguide to microstrip transition showing a plurality of holes disposed around a probe coupled to a microstrip line.
Figure 2:
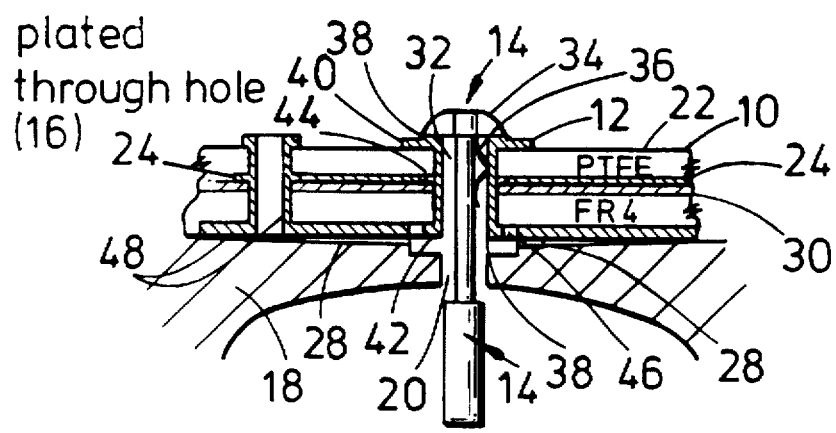
FIG. 2 is a cross-section taken in the lines A—A through the waveguide to microstrip transition shown in FIG. 1 in accordance with an embodiment of the present invention.

Reference is first made to FIG. 1 of the drawings which depicts a top view of a circuit board generally indicated by reference numeral 10 which has a microstrip line 12 (shown in FIG. 2) terminating in a plated through-hole and probe 14. Four plated through-holes 16 are disposed around the probe 14 as shown. Reference is now made to FIG. 2 of the drawings which is a cross-sectional view on the lines A—A shown in FIG. 1 and shows a cross-section through one of the plated through-holes 16 and the probe 14.

The circuit board 10 shown coupled to the top of a waveguide 18 which has an aperture 20 therein for receiving the waveguide probe 14. The circuit board 10 is a multilayer laminate and has an upper polytetrafluoroethylene (PTFE) layer 22 disposed over a copper ground plane 24 bonded thereto, a bottom layer of FR4, which is a fibreglass resin material, and a copper bottom ground pad 28 which is in electrical and mechanical contact with the waveguide 18. The PTFE 22 and ground plate 24 are bonded to the FR4 by a prepreg or glue layer 30. The structure of microstrip boards are well-known and the manufacture of such a board requires initially separate PTFE and FR4 boards which has copper on both sides thereof. The copper is then etched off from one side of the FR4 and the PTFE and FR4 are bonded with prepreg under high pressure.

The probe 14 passes through plated through-hole 32 which registers with aperture 20 and the probe 14 is soldered to the microstrip line 12 at the top of the board by solder joint 34 as shown. The waveguide probe includes a kinked portion 36 which abuts the plated sides 38 of the hole to secure the waveguide probe 14 in the centre of the hole 32. Plating of hole 32 is achieved by drilling the through-hole in the board 10 prior to etching. Plating results in conductive material, i.e. copper, is on the insides of the hole 32 shown as well as on the top 40 and bottom surface 42 of the board 10. It will be appreciated that there are circumferential gaps 44,46 between the plating of the through-hole and the ground plane 24 and ground pad 28 respectively; these gaps preventing shorting of the signal from the probe to ground.

Figure 3:
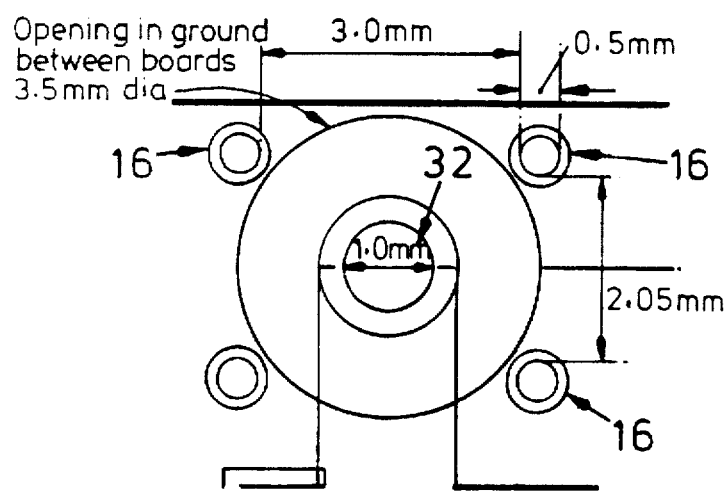
FIG. 3 is an enlarged view FIG. 1 showing the spacing and dimension of the plated through-hole in accordance with the embodiment of the present invention.

Each plated through-hole 16 is plated on the inside in the same way as the through-hole 32 for the waveguide probe 14. In this case the plating 48 is continuous with and merges with the ground plane 24 and the ground pad 28. These holes are made by drilling prior to etching in the same way as the waveguide probe hole. The four holes 16 are disposed about the periphery of the probe 14 and act as a barrier to leakage of the RF signal from the probe, thus limiting leakage into the PTFE and FR4 material of the circuit board. For frequencies in the range of (10.95–11.7) Gigahertz, the holes are spaced apart as shown in FIG. 3. Each plated through-hole 16 has an internal diameter of 0.5 mm and the probe hole 32 has an internal diameter of 1.0 mm. The spacing between the inner surface of the two upper through-holes and also of the two lower through-holes 16, as viewed in FIG. 3, is 3.00 mm, whilst the spacing between the inner surfaces of the through-holes 16 on each side is 2.05 mm. The opening in the ground between boards is 3.5 mm in diameter. The size of hole and hole distribution has been found to provide a suitable leakage barrier to RF frequencies in the aforementioned range and they also provide a transition impedance which is similar to the characteristic impedance of 50 ohms providing satisfactory matching and minimising leakage into the board. It will be appreciated that the spacing of holes in relation to each other is of importance because the size of the gap between the holes dictates how much RF signal can pass between the holes. Although the hole diameter does influence the passage of unwanted signal, the dominant factor is the spacing between the edge of the holes.

It will be appreciated that any form of conductive material around the probe would be adequate the reduce leakage into the board material as long as only small or no gaps were left between the conductive sections.

Figure 4:
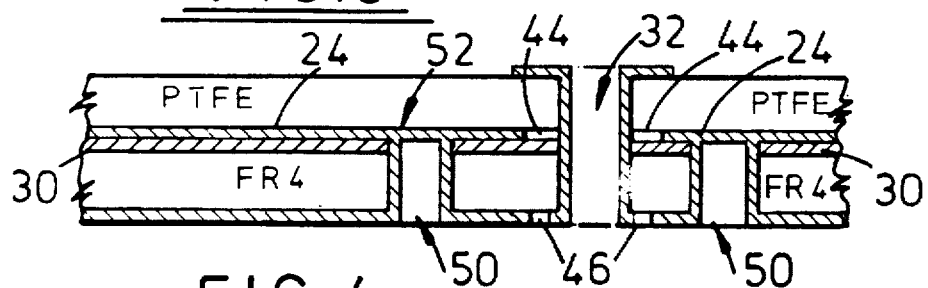
FIG. 4 is a view similar to FIG. 2 depicting plated blind holes.
Figure 5:
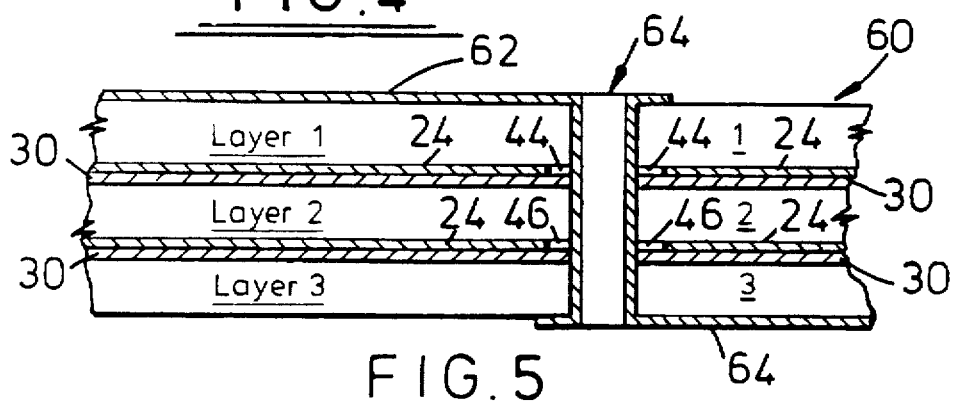
FIG. 5 is a sectional view similar to FIG. 2 of a microstrip to microstrip transition connection through a three layer circuit board.

It will also be appreciated that various modifications may be made to the embodiment hereinbefore described without departing from the scope of the invention. For example, the holes 16 do not require to pass through the entire circuit board. Because it has been found that the FR4 is the dominant factor for providing leakage into the circuit board in comparison to the PTFE layer, blind holes may also be used resulting in holes in the FR4 material, but not through the PTFE. This is best seen in FIG. 4 of the drawings where like numerals refer to like parts of FIGS. 1 to 3 and where blind holes 50 pass through the FR4 material only, instead of the through-plated vias. The blind holes 50 in the FR4 material are formed by drilling holes through the FR4 after laminating the boards but prior to plating the holes. Holes 50 are connected to the ground plane 24 at the FR4/PTFE junction 52. In addition, the size and spacing of the holes are dependent on the signal frequency used. In addition, it will be understood that other values of characteristic impedance may be used, for example, 75 ohms, as required. The holes do not require to be spaced around the probe on the circumference of a circle; this is just a convenient way to space the holes. An interconnection can be formed on a multilayer circuit board using similar principles and structure to the waveguide to conductor RF transition. This is shown in FIG. 5 of the drawings. In this case a circuit board 60 has 3 layers, layer 1, layer 2 and layer 3, and a copper microstrip line 62 on layer 1 is connected to a copper microstrip line 64 on layer 3 via copper plated through hole 32. The layers 1,2 and 2,3 are separated by prepreg material 30. As with the RF transition a plurality of plated through holes or blind holes can be placed around the interconnection holes to avoid loss of the signal into layer 2. In addition, the microstrip to microstrip transition can use either plated through holes or blind holes sized and spaced as appropriate to minimize leakage.

We claim:

1. A waveguide to microstrip circuit transition comprising a circuit board disposed between the waveguide and the microstrip circuit, a plated probe hole formed in the circuit board, a waveguide probe passing through the plated probe hole and projecting therefrom and being coupled to a signal conductor of the microstrip circuit, and a plurality of plated holes disposed in the circuit board around the waveguide probe, the plated holes being coupled to ground and being arranged to reduce leakage of electromagnetic energy propagating on the waveguide probe from leaking into the circuit board.

2. A waveguide to microstrip circuit transition comprising a circuit board disposed between the waveguide and the microstrip circuit, a waveguide probe passing through the circuit board and projecting therefrom and being coupled to a signal conductor of the microstrip circuit, and four plated holes disposed in the circuit board around the waveguide probe, the plated holes being coupled to ground and being arranged to reduce leakage of electromagnetic energy propagating on the waveguide probe from leaking into the circuit board.

3. A waveguide to microstrip circuit transition comprising a circuit board disposed between the waveguide and the microstrip circuit, a waveguide probe passing through the circuit board and projecting therefrom and being coupled to a signal conductor of the microstrip circuit, and a plurality of plated holes disposed in the circuit board on the circumference of a circle centered on the waveguide probe, the plated holes being coupled to ground and being arranged to reduce leakage of electromagnetic energy propagating on the waveguide probe from leaking into the circuit board.

4. A waveguide to microstrip circuit transition comprising a circuit board disposed between the waveguide and the microstrip circuit, a waveguide probe passing through the circuit board and projecting therefrom and being coupled to a signal conductor of the microstrip circuit, and a plurality of plated blind holes extending only through the circuit board and disposed around the waveguide probe, the plated holes being coupled to ground and being arranged to reduce leakage of electromagnetic energy propagating on the waveguide probe from leaking into the circuit board.

* * * * *